United States Patent [19]

Fukuhara et al.

[11] Patent Number: 4,525,870

[45] Date of Patent: Jun. 25, 1985

[54] AUTOMOTIVE RADIO RECEIVER WITH RADIO FREQUENCY INTERFERENCE ELIMINATION CIRCUIT

[75] Inventors: Hiroshige Fukuhara; Norio Fujiki, both of Yokosuka, Japan

[73] Assignee: Nissan Motor Company, Limited, Yokohama, Japan

[21] Appl. No.: 399,688

[22] Filed: Jul. 19, 1982

[30] Foreign Application Priority Data

Jul. 20, 1981 [JP] Japan .................................. 56-112344
Aug. 27, 1981 [JP] Japan .................................. 56-134477
Nov. 27, 1981 [JP] Japan .................................. 56-190087

[51] Int. Cl.³ .............................................. H04B 1/10
[52] U.S. Cl. ..................... 455/297; 455/219; 455/298; 455/312
[58] Field of Search ............... 455/219, 222, 212, 223, 455/238, 297, 298, 307, 312; 381/94, 107

[56] References Cited

U.S. PATENT DOCUMENTS

| | | | |
|---|---|---|---|
| 3,995,219 | 11/1976 | Rasehorn et al. | 455/297 |
| 4,000,414 | 12/1976 | Hansen | 455/222 |
| 4,066,845 | 1/1978 | Kishi | 455/212 |
| 4,178,552 | 12/1979 | Amazawa et al. | 455/223 |
| 4,198,541 | 4/1980 | Fukushima | 455/312 |
| 4,326,297 | 4/1982 | Sato et al. | 455/222 |

FOREIGN PATENT DOCUMENTS 53-42567 11/1978 Japan .
54-32915 3/1979 Japan .
54-98509 8/1979 Japan .
55-32301 8/1980 Japan .
56-7621 2/1981 Japan .

OTHER PUBLICATIONS

"Grundig Tech. Inf." (Germany), vol. 24, No. 1 (1977) by Spiegel.

Primary Examiner—Jin F. Ng
Attorney, Agent, or Firm—Schwartz, Jeffery, Schwaab, Mack, Blumenthal & Evans

[57] ABSTRACT

An automotive radio receiver with a radio frequency interference elimination includes a noise detector adapted to detect noise in the power source wiring and a circuit for eliminating radio frequency interference noise. The detector is physically connected to the power source wiring so that it can satisfactorily detect noise in the power source wiring such as spark ignition noise and switching noise of the automotive electric equipments. The noise elimination circuit includes a switch normally closed and responsive to the noise signal produced by the noise detector to open, and a capacitor for holding the radio signal level while the switch is opened and discharging the constant-level signal for reproduction of the radio sound.

10 Claims, 21 Drawing Figures

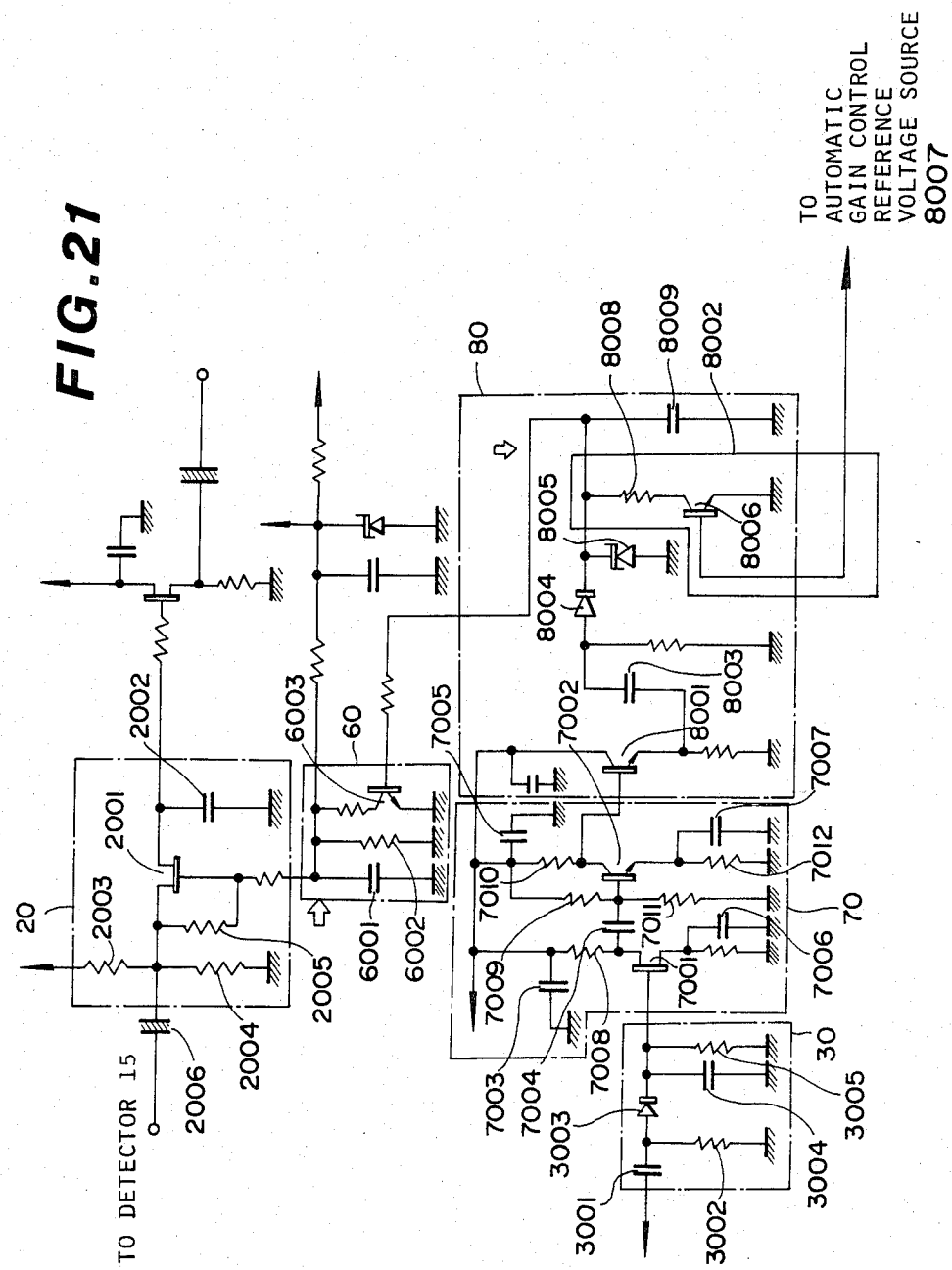

AUTOMOTIVE RADIO RECEIVER WITH RADIO FREQUENCY INTERFERENCE ELIMINATION CIRCUIT

BACKGROUND OF THE INVENTION

The present invention relates to an automotive radio receiver incorporating a radio frequency interference elimination circuit. More specifically, the invention relates to a radio frequency interference elimination circuit for an automotive radio receiver for eliminating noise in radio output sound created by the ignition system of an automotive engine and other automotive devices.

In an automotive vehicle, radio frequency interference can be produced from many sources such as a spark ignition noise. This radio frequency interference causes noise in the audio output of the radio receiver. Vehicular radio frequency interference is particularly intense in the AM radio band.

Radio frequency interference in an automotive radio receiver is mainly due to sharply-peaked noise signals created by the spark ignition system, alternater switching and so on. For suppressing such radio frequency interference, various systems have been proposed. For example, Japanese Patent Pre-Publication (Tokkai) Sho. No. 54-98509, pre-published on Aug. 3, 1979 illustrates a radio frequency interference suppression system having a gate circuit inhibiting reception of the broadcasting signal while noise is being generated and a hold circuit for holding the receiving signal level immediate before the noise starts.

However, the conventional radio frequency interference suppression system can not satisfactorily and successfully suppress noise in the audio output thereof. In the foregoing specific prior art, waveform distortion can be caused by holding the signal level while the noise is being generated.

It is easy to detect relatively intense radio frequency interference radiation such as ignition noise by providing a noise detector antenna in the engine room. However, even with such a noise detector antenna, it is difficult to detect relatively weak radio frequency interference such as switching noise in the voltage regulator or the vehicle accessories.

SUMMARY OF THE INVENTION

Therefore, it is an object of the present invention to provide an automotive radio receiver having a circuit for effectively detecting any radio frequency interference and satisfactorily eliminating the interference without seriously distorting the broadcasting radio signal.

To accomplish the above-mentioned and other objects, there is provided an automotive radio receiver with a radio frequency interference elimination circuit, according to the present invention, which includes a noise detector adapted to detect noise in the power source wiring and a circuit for eliminating radio frequency interference noise. The detector is physically connected to the power source wiring so that it can satisfactorily detect noise in the power source wiring such as spark ignition noise and switching noise of the automotive electric equipment. The noise elimination circuit includes a switch normally closed but opens in response to the noise signal produced by the noise detector to open, and a capacitor for holding the radio signal level while the switch is opened and discharging the constant-level signal for reproduction of the radio sound.

BRIEF DESCRIPTION OF THE DRAWINGS

The present invention will be understood more fully from the detailed description given herebelow and from the accompanying drawings of the preferred embodiment of the present invention, which, however, should not be taken as limitative to the invention but for elucidation and explanation only.

In the drawings:

FIG. 21 is a circuit diagram showing details of the radio receiver circuit of FIG. 2.

DESCRIPTION OF THE PREFERRED EMBODIMENT

Figure 1:
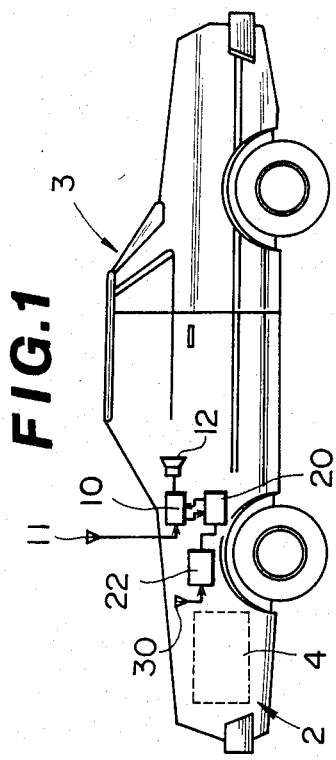
FIG. 1 is a explanatory side elevation of an automotive radio receiver with a circuit for elimination of radio frequency interference.

Referring now to the drawings, particularly to FIG. 1, the general circuit structure of an automotive radio receiver circuit with a radio frequency interference elimination circuit is shown in block form as installed in an automotive vehicle. A radio receiver circuit 10 is connected to an automotive antenna 11 and a speaker 12. The antenna 11 is adapted to receive radio broadcasting signals and feed them to the radio receiver circuit 10. The radio receiver circuit 10 outputs audio signals to the speaker 12 to reproduce audio sounds. In the embodiment shown, the radio receiver includes an auto-gain control circuit for regulating the output level of the radio receiver. The radio receiver 10 is associated with a radio frequency interference elimination circuit 20. The radio frequency interference elimination circuit 20 is connected to an internal noise detector 30 via a wideband amplifier 22. The noise detector 30 is located in the engine compartment 2 of an automotive vehicle 3 near the engine block 4, which is one of major sources of noise.

Figure 2:
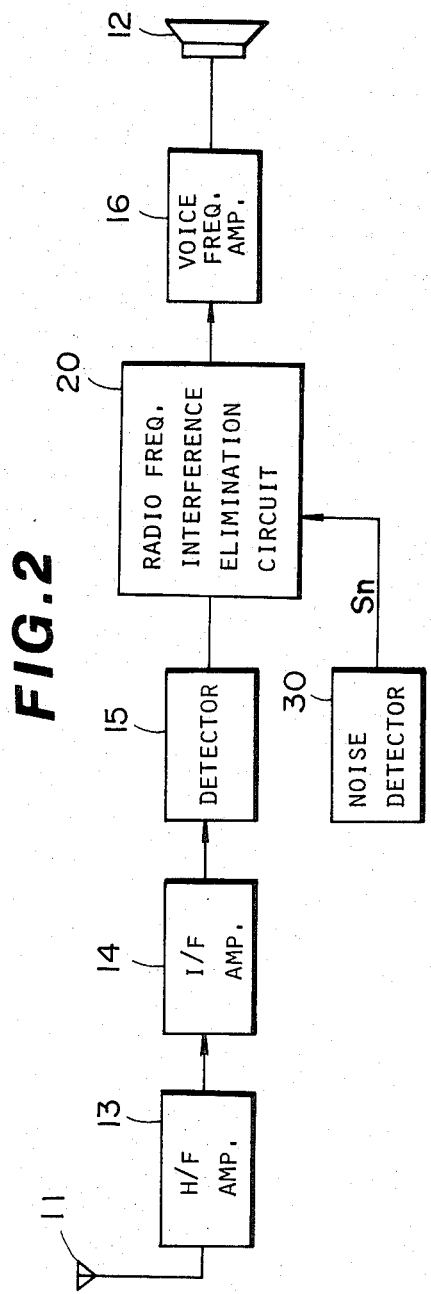
FIG. 2 is a schematic block diagram of the preferred embodiment of the automotive radio receiver with a radio frequency interference elimination circuit according to the present invention.

As shown in FIG. 2, the radio receiver circuit 10 with the radio frequency interference elimination circuit 20 generally includes a high-frequency amplifier 13, an intermediate frequency amplifier 14, a detector 15 and a voice frequency amplifier 16. The radio frequency interference elimination circuit 20 is interposed between the detector 15 and the voice frequency amplifier 16. The noise detector 30 is connected to the radio frequency interference elimination circuit 20 to supply a detector signal $S_n$ when the radio frequency interference noise is detected.

Figure 3:
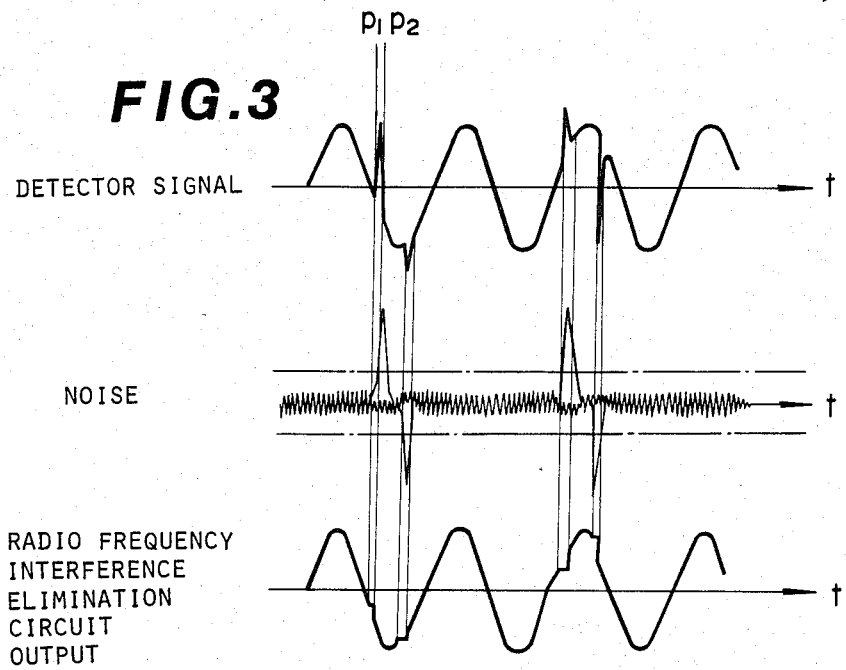
FIG. 3 shows some exemplary waveforms in the radio receiver of FIG. 2.

In response to the detector signal $S_n$, the radio frequency interference elimination circuit 20 holds the radio signal level immediately prior to receiving the detector signal. The function of the radio frequency interference elimination circuit 20 can be appreciated from FIG. 3 in which are illustrated waveforms of the detector output, an exemplary noise signal and the corresponding radio frequency interference elimination circuit output. As apparent from FIG. 3, the detector output is influenced by the noise signal in such a manner that its normal sinusoidal profile includes spikes matching the more intense noises. With the radio frequency interference elimination circuit 20, the audio output level is held constant during noise peaks at the level immediately prior to the noise being created. Assuming that at time $p_1$ the noise signal becomes sufficiently intense to cause radio frequency interference and the intense noise signal terminates at time $p_2$, the noise detector 30 produces the detector signal $S_n$ at time $p_1$ and maintains the audio signal until time $p_2$. While the detector signal $S_n$ is being received, the radio frequency interference elimination circuit 20 holds the audio signal level at the level of time $p_1$. In this way, generally speaking, interference of the radio output by noise can be prevented.

Figure 4:
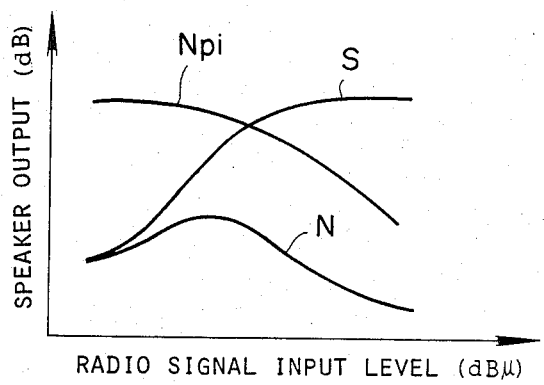
FIG. 4 shows the characteristics of an auto-gain control in the radio receiver of FIG. 2.

FIG. 4 shows the characteristics of the automatic gain control employed in conventional radio receivers. In FIG. 4, the line N shows variations of background noise level, the line S shows variations of the radio signal level and the line Npi shows variations of pulse-form noise signal level.

Figure 5:
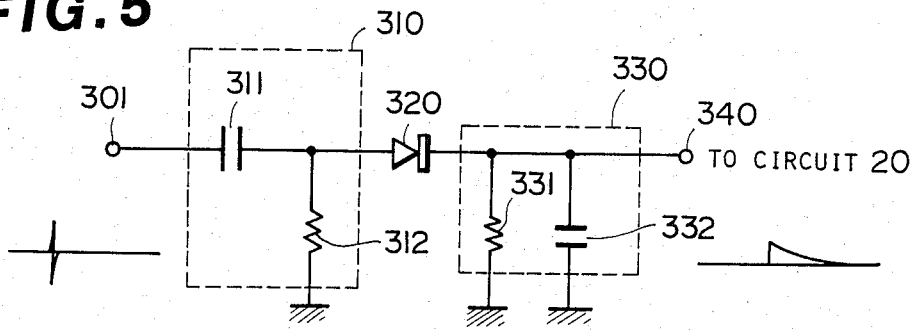
FIG. 5 is a circuit diagram of a noise detecting circuit in the radio receiver circuit of FIG. 2.

FIG. 5 is a circuit diagram of the noise detector 30 in the radio receiver circuit of FIG. 2. The noise detector 30 includes a connector terminal 301 to be connected to a cable of a power source wiring. The noise detector 30 generally comprises a high-pass filter 310, a delay circuit 330 and a diode 320 inserted between the high-pass filter and the delay circuit. The high-pass filter 310 is adapted to eliminate components of the noise signal with a relatively long period e.g., $> 10$ $\mu$s which are not likely to cause radio freqeuncy interference, such as switching spikes from a alternator, and to have a resistance value substantially matching that at frequencies higher than the cut-off frequency. The high-pass filter 310 comprises a capacitor 311 and a resistor 312. The resistance value of the resistor 312 is adapted to match the impedance of the cable at frequencies higher than the cut-off frequency. The capacitance of the capacitor is chosen in accordance with the preselected cut-off frequency and the resistance value of the resistor 312. For example, assuming the noise frequency not likely to cause radio frequency interference is about 100 KHz, the cut-off frequency for the noise level required to drop the noise at least 40 dB should be about 10 MHz. The impedance of the cable is about 100$\phi$ for frequencies higher than 10 MHz. Therefore, the resistance value of the resistor 312 should be selected to be about 100$\phi$. As a result, the capacitance of the capacitor 312 should be 150 $\mu$F as obtained from the following equation:

$$C=[1/(2\pi f_c R)](f_c: \text{cut-off frequency})$$

On the other hand, the delay circuit 330 comprises a resistor 331 and a capacitor 332. The capacitance of the capacitor 332 defines the rise time and the fall time of the detector signal produced when radio frequency interference noise is detected. The rise time is chosen to satisfactorily quickly respond to detection of radio frequency interference noise.

Figure 6:
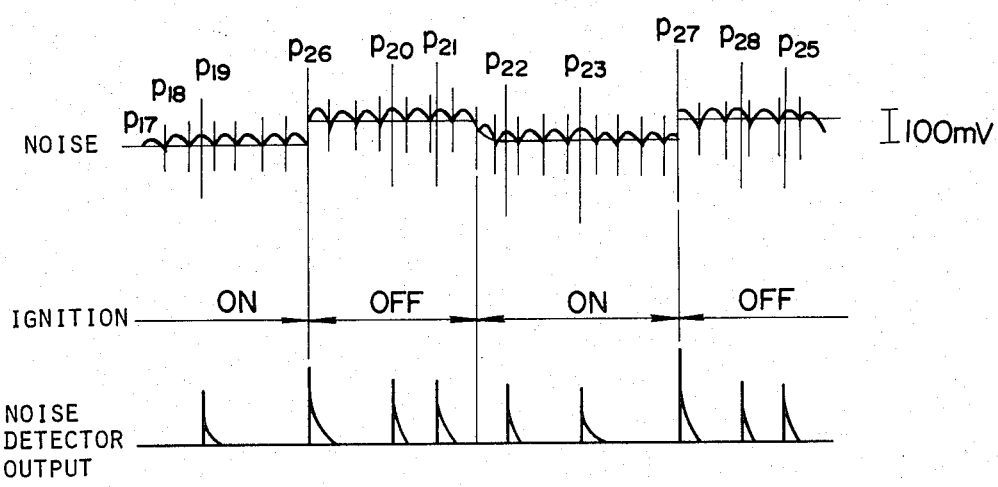
FIG. 6 shows the noise detecting circuit output in relation to the noise created in the vehicle devices.
Figure 7:
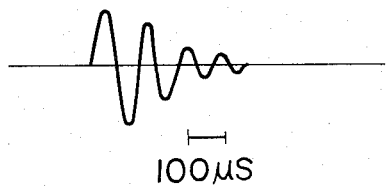
FIG. 7 shows an exemplary waveform of noise which would not interfere with radio output.
Figure 8:
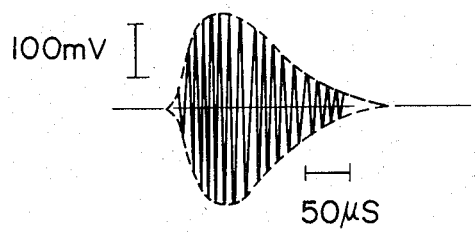
FIG. 8 shows a waveform similar to FIG. 7 but showing that of a noise signal causing radio frequency interference.

FIG. 6 illustrates the operation of the noise detector 30 of FIG. 5. In FIG. 6, it is assumed that the radio frequency interference noise is created at time periods $p_{17}, p_{18}, \ldots p_{28}$. The noise created at time $p_{26}$ is created due to opening and closing of the primary-side points in the ignition system. The noise at time $p_{17}$ is ripple voltage having a period in the range of several hundreds $\mu$s to several ms. The noise at time $p_{18}$ is spike noise of relatively long period, e.g., about 10 $\mu$s, as shown in the enlarged profile in FIG. 7. The noise at the periods $p_{19}$ to $p_{25}$ are switching noises of a voltage regulator or other vehicle electric devices. At times $p_{26}$ and $p_{27}$, spark noises as shown in FIG. 8 are created. The noises created at times $p_{19}$ to $p_{27}$ has frequencies from several hundred KHz to several hundred MHz and are likely to cause radio frequency interference. On the other hand, the noise created at times $p_{17}$ and $p_{18}$ will not cause radio frequency interference and can be absorbed satisfactorily by the high pass filter 310. The noise detector 30 produces the detector signal to be outputted from an output terminal 340 everytime the radio frequency interference noise is created, such as at times $p_{19}$ to $p_{27}$.

Figure 9:
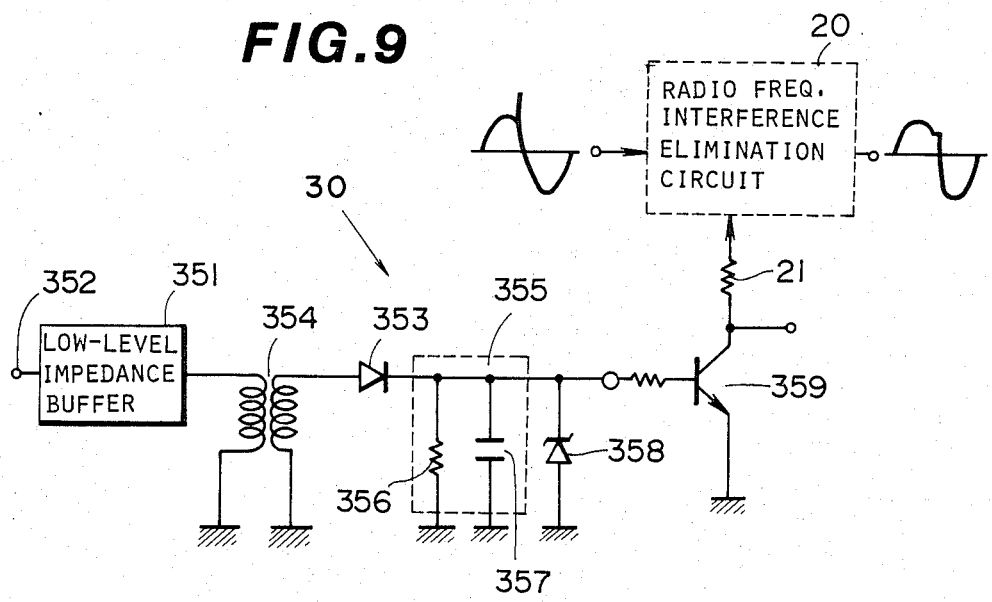
FIG. 9 is a circuit diagram of a pulse signal generator in the radio receiver circuit of FIG. 2.
Figure 10:
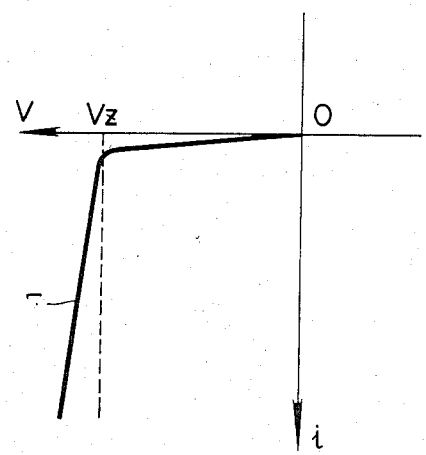
FIG. 10 shows voltage characteristics of a Zener diode in the pulse signal generator of FIG. 9.

FIG. 9 shows a modification of the noise detector of FIG. 5. In this modification, a low-level impedance buffer 351 is connected to the cable in the power source wiring through the input terminal 352. The low-level impedance buffer 351 is, in turn, connected to a diode 353 via a connecting transformer 354. The delay circuit 355 having the similar circuit construction as that of FIG. 5 and thus including a resistor 356 and a capacitor 357, is connected to the diode 353. A Zener diode 358 is connected in parallel to the delay circuit. The Zener diode 358 has volt-ampere characteristics as illustrated in FIG. 10. A transistor 359 is connected to the delay circuit 355 via a resistor 360 at the base electrode and the radio frequency interference elimination circuit 20 via a resistor 21 at the collector electrode. The emitter of transistor 359 is grounded.

Figure 11:
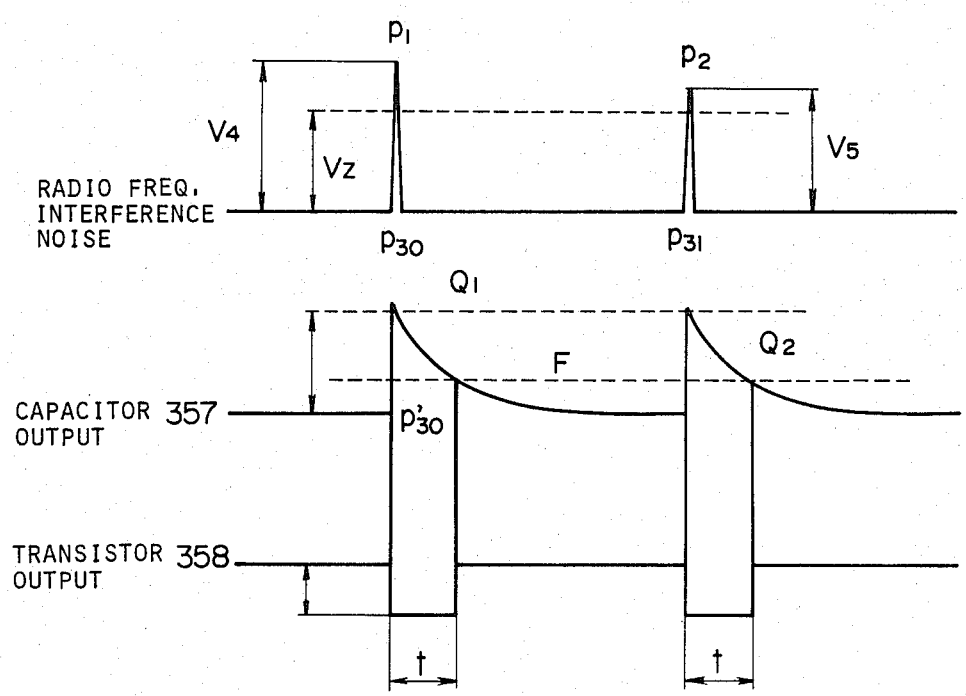
FIG. 11 shows waveforms of outputs in the pulse signal generator of FIG. 9.

The function of the noise detector 30 as set forth will be described hereafter with reference to FIG. 11. In FIG. 11, it is assumed that the radio frequency interference noise spikes $P_1$ and $P_2$ having voltage $V_4$ and $V_5$ above the Zener voltage $V_z$ of the Zener diode are respectively created at times $p_{30}$ and $p_{31}$. The radio frequency interference noise spikes $P_1$ and $P_2$ are inputted to the diode 353 via the low-level impedance buffer 351 and the connecting transformer 354, in spiked waveforms as illustrated in FIG. 11. When the voltage of the radio frequency interference noise exceeds the Zener voltage at time $p_{30}'$, the Zener diode 358 becomes conductive. At the same time, the capacitor 357 is charged according to variation of the noise level. When the charge level in the capacitor 357 exceeds the Zener voltage, the capacitor 357 discharges the charged voltage in response to the opening of the Zener diode 358 at time $p_{30}'$. The output of the capacitor 357 has the waveform represented by line $Q_1$. In response to the signal $Q_1$ from the capacitor 357, the transistor 359 is turned on. The transistor will be turned on in response to a signal having voltage above a level F, e.g., about 0.6V, as shown in FIG. 11. In this case, the transistor 359 is maintained on for the period t while the signal level remains above the level F. In this momer, a pulse of duration t is produced at the collector electrode of the transistor 359. As shown in FIG. 11, even for the radio frequency interference noise $P_2$ having a level lower than that of the noise $P_1$, the level at which the capacitor 357 discharges the charged voltage is kept at a constant level to maintain the pulse duration of the output detector signal constant.

In the embodiment shown, the Zener diode 358 is connected to the cathode of the diode 353 in order to obtain a pulse of constant duration. However, it would be possible to change the connection of the Zener diode 358 and the diode 353 and use them with an PNP transistor 359 to obtain the same effect.

Figure 12:
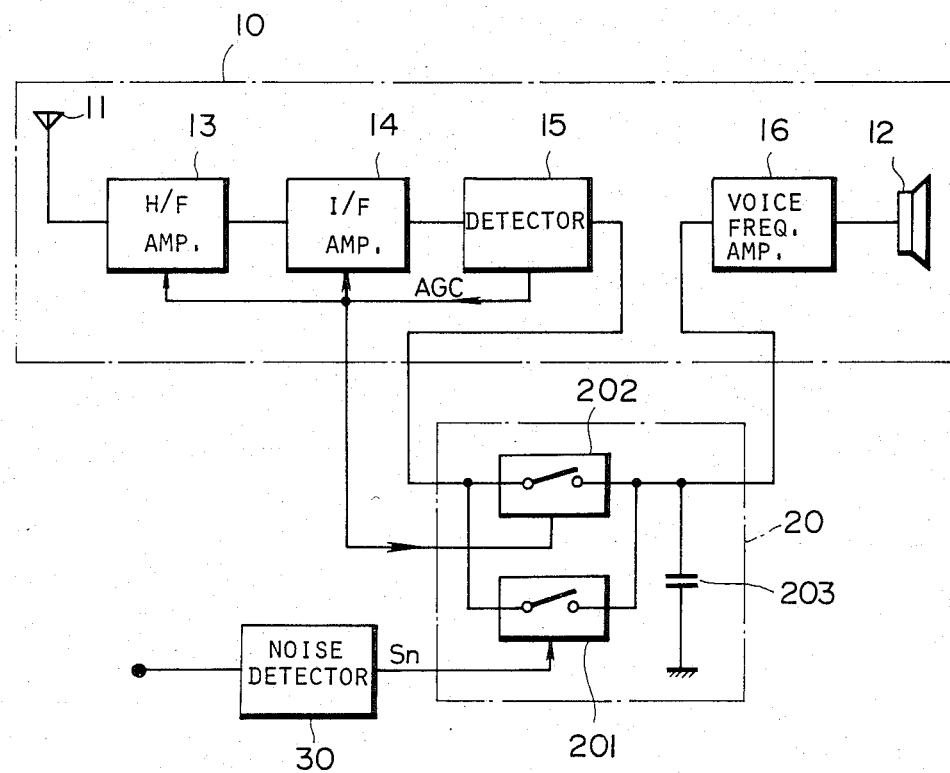
FIG. 12 is a schematic block diagram of the radio receiver circuit, in which a radio frequency interference elimination circuit according to the present invention has been illustrated in schematic circuit form.

FIG. 12 shows one embodiment of the radio frequency interference elimination circuit 20 employed in the radio receiver circuit with automatic gain control. As described with reference to FIG. 2, the radio receiver circuit generally comprises the antenna 11, the high frequency amplifier 13, the intermediate frequency amplifier 14, the detector 15, the voice frequency amplifier 16 and the speaker 12. The radio frequency interference elimination circuit 20 is interpositioned between the detector 15 and the voice frequency amplifier 16. From the detector, an AGC (automatic gain control) voltage is fed back to the high frequency amplifier 13, the intermediate frequency amplifier 14 and the radio frequency interference elimination circuit 20. On the other hand, the radio frequency interference elimination circuit 20 is connected to the noise detector 30 having the circuit structure as set forth with reference to FIGS. 5 and 9.

As shown in FIG. 12, the radio frequency interference elimination circuit 20 comprises a pair of gate switches 201 and 202 connected in parallel and a capacitor 203. The gate switch 201 is connected to the noise detector 30 and, in turn, the gate switch 202 receives the AGC voltage. The gate swtich 201 is adapted to be maintained open for the duration of the detector signal from the noise detector 30. On the other hand, the gate switch 202 is adapted to be kept open as long as the AGC voltage is below a predetermined value.

Figure 13:
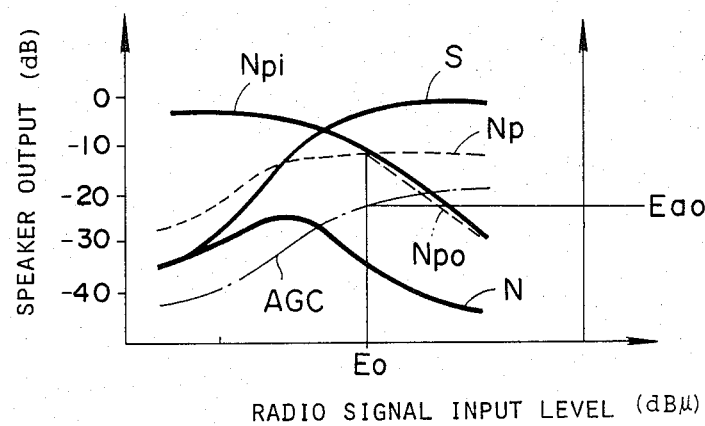
FIG. 13 is an illustration similar to FIG. 4 and showing the characteristics of auto-gain control including the effect of the radio frequency interference elimination circuit.

In FIG. 13, there has been illustrated the speaker output characteristic in the radio receiver circuit of FIG. 12. Similar to the foregoing FIG. 4, line Npi represents the noise level, line S represents audio signal level and line N represents the background noise level in the speaker. In addition, line AGC represents variation of AGC voltage and line Npo represents the adjusted noise level in the radio frequency interference elimination circuit 20 of FIG. 12. In FIG. 13, the lines S and N show rms values of the audio signal level and the background noise level and, on the other hand, the lines Npi, Np and Npo show the peak values of the pulse-form noise input, conventional noise level and adjusted noise level in the present invention, respectively. The gate switch 202 is adapted to switch between open and close at input level $E_o$. This AGC voltage $E_{ao}$ is the turning point of the gate switch 202.

In the operation of the circuit of FIG. 12, under normal condition, AGC voltage exceeds voltage Eao and the noise detector is in its rest state so that both switches 201 and 202 are closed. Thus, audio output simultaneously charges capacitor 203 and proceeds to the amplifier 16 for output through the speaker 12. The charge on capacitor 203 responds quickly to variation of the audio signal level so as to accurately reflect the output level at all times. If the received broadcast signal level should drop below Eo, then AGC voltage will drop below Eao, switch 202 will open, and the output of detector 15 will pass solely through switch 201. In this case, when noise detector 30 outputs the detector signal Sn, switch 201 will open to cut off the supply of the audio signal the voice frequency amplifier 16. However, capacitor 203 now discharges to amplifier 16 at a voltage matching that of the audio signal just before production of detector signal Sn. Switch 201 closes again to reconnect the audio output after the noise detector 30 returns to its rest state.

Figure 14:
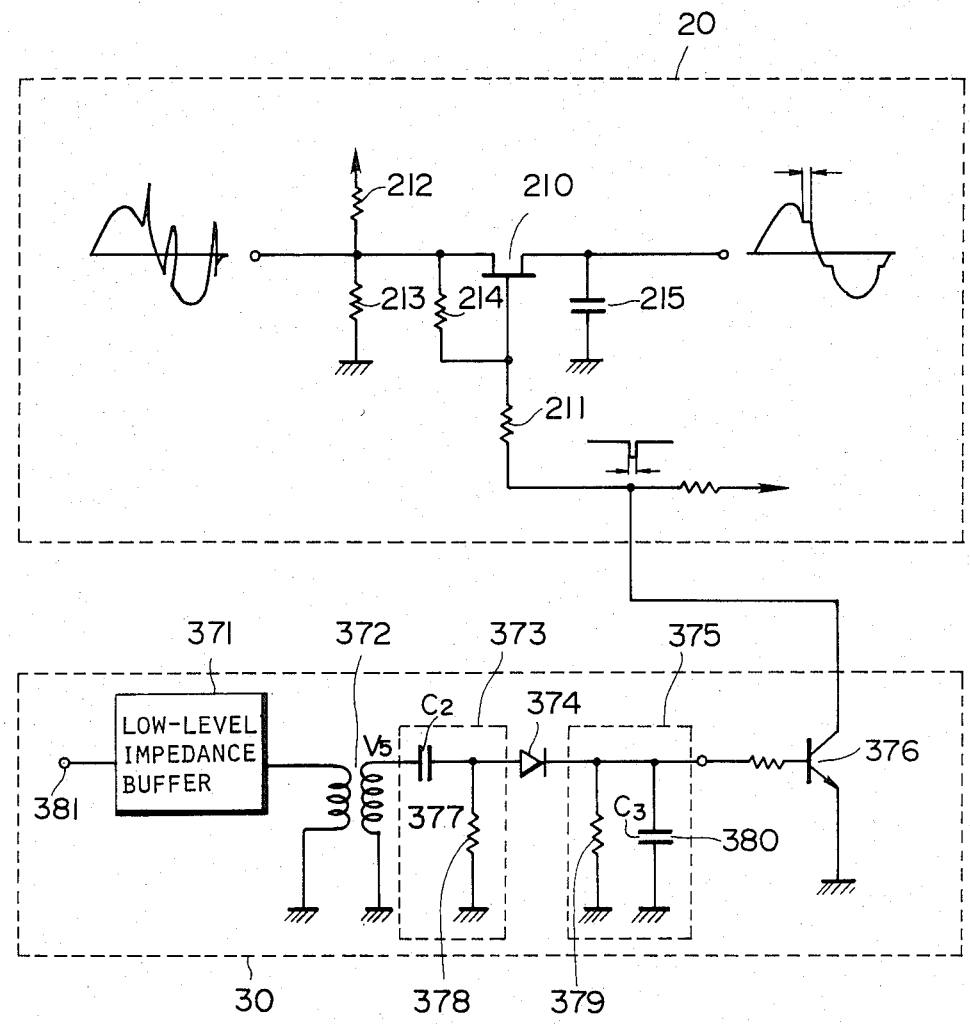
FIG. 14 is a circuit diagram of the radio frequency interference elimination circuit in conjunction with the pulse signal generator of FIG. 9.

FIG. 14 shows another embodiment of the noise detector 30 in combination with the radio frequency interference elimination circuit 20 of FIG. 2. In this embodiment, noise detector 30 comprises the low-level impedance buffer 371, connecting transformer 372, delay circuit 373, diode 374, delay circuit 375 and transistor 376. The delay circuit 373 is connected to the cable or harness in the power source wiring as the noise source through the low-level impedance buffer 371 and the connecting transformer 372. The delay circuit 373 includes a capacitor 377 and a resistor 378. On the other hand, the delay circuit 375 includes a resistor 379 and a capacitor 380 connected in parallel similar to the delay circuit of the noise detector of FIG. 9. The diode 374 is interposed between the delay circuits 373 and 375. The delay circuit 375 is connected to the base of the transistor 376 which is, in turn, connected to the radio frequency interference elimination circuit 20 at the collector thereof.

In the circuit construction as set forth, the voltages across the capacitors 377 and 380 are determined in correspondence to the static electrical capacitances thereof. Specifically, the charging voltage v of the capacitor 377 can be obtained from the following equation:

$$v = [C_2/(C_2+C_3)] \cdot V_5$$

where

C₂ and C₃ are capacities of respective capacitors 377 and 380, and

V₅ is the input voltage.

Figure 15:
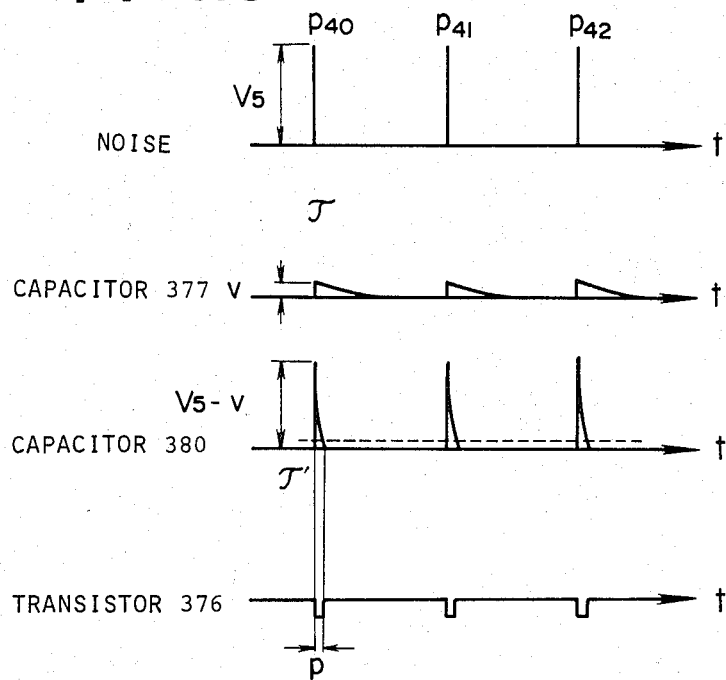
FIG. 15 shows waveforms of outputs in the radio frequency interference elimination circuit of FIG. 12 in the case in which the frequency of occurrence of noise signal is low.

FIG. 15 is a timing chart for the noise detector 30 of FIG. 14. Here it is assumed that the radio frequency interference noises, such as spark ignition noises, are produced at times $P_{40}$, $P_{41}$, $P_{42}$... The capacitor 377 is charged depending on the voltage of the noise fed thereto through the input terminal 381, the low-level impedance buffer 371 and the connecting transformer 372. After the noise stops, the capacitor 377 discharges with delay time τ defined by the values of resistor 378 and the capacitor 377. The variation of the discharged voltage is as illustrated by line v in FIG. 15.

At the same time, the charge voltage of the capacitor 380 is $V_5 - v$ and varies as represented by line $V_5 - v$ in FIG. 15. Similar to the foregoing delay circuit 373, the delay circuit 373 provides a delay time τ' determined by the ratings of the resistor 379 and the capacitor 380. In response to the voltage increase in the delay circuit output due to discharge of the capacitor 380, the transistor is turned on. In the preferred embodiment, the transistor 376 is turned on while the output voltage of the delay circuit 375 is above the predetermined voltage E, e.g., about 0.6V. This way, the output voltage at the collector electrode of the transistor 376 varies as illustrated in FIG. 15 to produce short, low-going pulses of duration pv.

Figure 16:
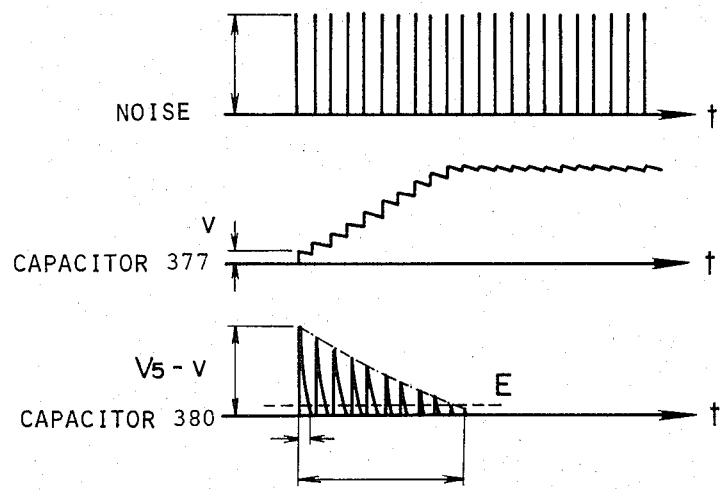
FIG. 16 shows waveforms of the outputs in the radio frequency elimination circuit similar to FIG. 12 but showing the case in which the frequency of occurrence of noise signals is high.

On the other hand, when the radio frequency interference noise occurs at intervals shorter than $p_v$ in FIG. 15, the charge voltage v in the capacitor 377 varies as illustrated in FIG. 16, increasing stepwise toward the input voltage V₅. As a result, the charge voltage $V_5 - v$ on the capacitor 380 is gradually reduced as the charge on the capacitor 377 increases, as shown in FIG. 16. When the charge voltage on the capacitor 380 becomes lower than the predetermined voltage E, the transistor is maintained in the cut-off state.

Returning to FIG. 14, the collector of the transistor 376 is connected to the base of a field-effect transistor 210 via a resistor 211. In response to the detector signal from transistor 376, the field-effect transistor 210 is cut-off. As a result, the radio frequency inputted from the detector via bias resistors 212, 213 and 214 is inhibited from passing through the field-effect transistor 210. Since the capacitor 215 holds the radio signal level immediately before the field-effect transistor 210 is cut-off, the capacitor 215 then discharges to maintain the level of the radio signal.

Figure 17:
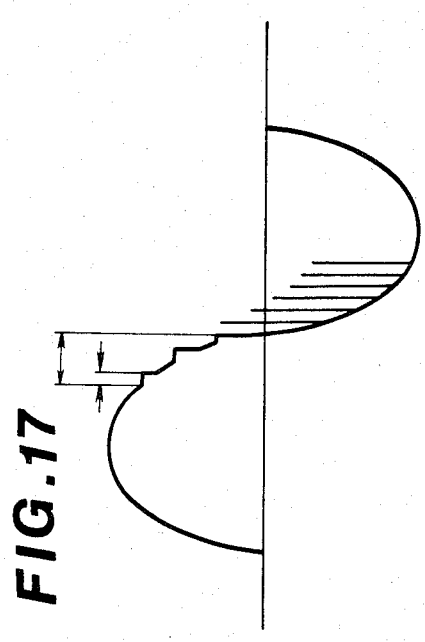
FIG. 17 shows an exemplary waveform of the output of the radio frequency interference elimination circuit of FIG. 13.

When noise occurrence is relatively frequent, the field-effect transistor 210 is repeatedly turned on and off as the detector signals are inputted to its base. In this case, due to the delay circuit 373, the occurrence of the detector signal is reduced to reduce distortion of the output signal of the radio frequency interference elimination circuit, as shown in FIG. 17.

Figure 18:
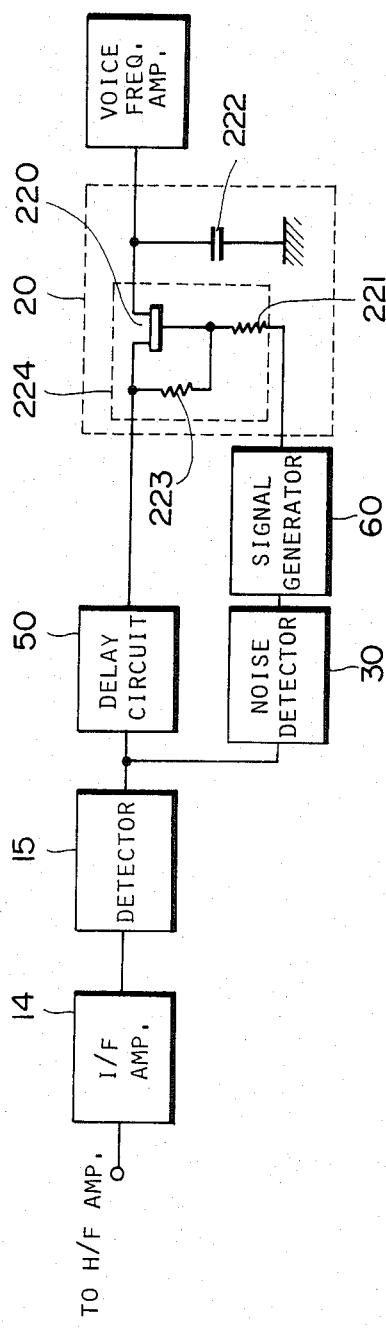
FIG. 18 is a schematic block diagram of the radio receiver circuit in which the radio frequency interference elimination circuit has been applied in a modified manner.

FIG. 18 shows another arrangement of the noise detector 30 in the radio receiver circuit. In this embodiment, the noise detector 30 is connected to the detector 15 which is, in turn, connected to the intermediate frequency amplifier 14. In parallel to the noise detector 30, a delay circuit 50 is inserted between the detector 15 and the radio frequency interference elimination circuit 20. The radio frequency interference elimination circuit 20 is in turn, connected to the noise detector 30 via a signal generator 60.

The noise detector 30 detects noise components in the audio signal output from the detector 15 and produces the detector signal. The detector signal is fed to the radio frequency interference elimination circuit 20 via the signal generator 60. The base of the field-effect transistor 220 receives the detector signal via the resistor 221 to cut off communication between the detector 15 and the capacitor 222 in the radio frequency interference elimination circuit 20 via the delay circuit 50. As a result, the capacitor 222 discharges at the voltage level immediately proceeding the noise.

Figure 19:
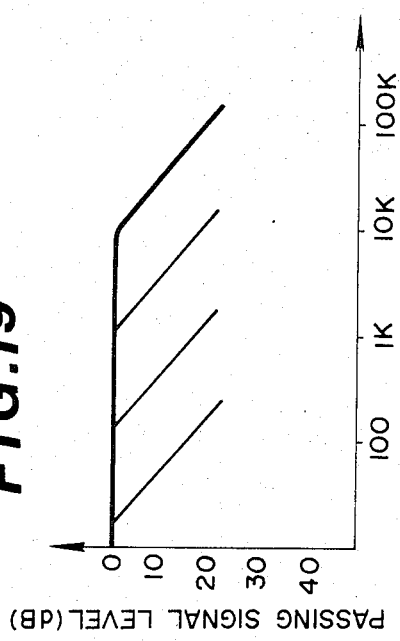
FIG. 19 shows characteristics of a variable impedance low-pass filter in the radio frequency interference elimination circuit of FIG. 18.
Figure 20:
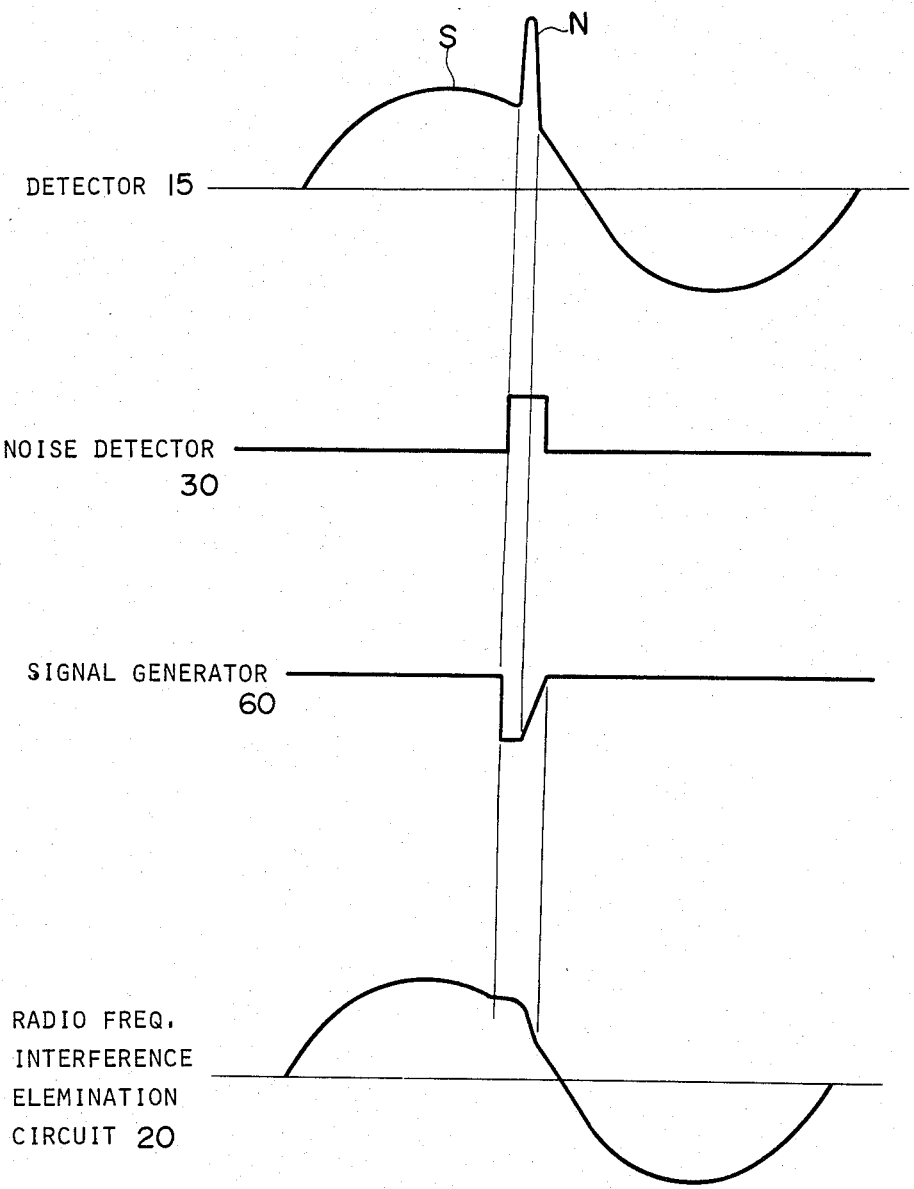
FIG. 20 shows exemplary waveforms of the outputs in the radio frequency interference elimination circuit of FIG. 18.

Typical waveforms pertinent to this embodiment are shown in FIG. 20. The detector signal is fed to the signal generator 60 which produces a detector signal which reflects the intensity of the noise. As shown in FIG. 20, the output of the signal generator 60 varies linearly with time after the radio frequency interference noise terminates. On the other hand, the field-effect transistor 220, the resistor 221, and the resistor 223 constitute a kind of variable impedance low-pass filter 224 having characteristics as shown in FIG. 19. As apparent herefrom, the passing characteristic of the variable impedance low-pass filter 224 varies in accordance with the signal level inputted thereto. Namely, the cut-off frequency for the lower amplitude inputs is kept relatively low and gradually increases as the input level increases. Therefore, while the detector signal is inputted at its minimum level, the signal level applied to the base of the field-effect transistor 220 is low to keep the cut-off frequency at a relatively low level. Then, as the signal level applied to the base increases, the cut-off frequency gradually increases. As a result, the audio frequency level is gradually and moderately returned to the radio signal input level after interruption due to noise, as shown in FIG. 19.

FIG. 21 shows the detailed circuitry of the preferred embodiment of the radio frequency interference elimination circuit and the noise detector. As in the foregoing embodiment of FIG. 14, the radio frequency interference elimination circuit 20 comprises a field-effect transistor 2001, a capacitor 2002 and bias resistors 2003, 2004, and 2005. The radio frequency interference elimination circuit 20 is connected to the detector of the radio receiver circuit via a field-effect capacitor 2006 at the source thereof. On the other hand, the gate of the field effect transistor 2001 in the radio frequency interference elimination circuit 20 is connected to the signal generator 60 which is, in turn, connected to the noise detector 30. As set forth with reference to FIG. 5, the noise detector 30 comprises a capacitor 3001, a resistor 3002, a diode 3003, a capacitor 3004 and a resistor 3005. The capacitor 3001 and the resistor 3002 constitute a high-pass filter which absorbs relatively low-frequency noise signals which may not interfere with the radio frequency and cause noise in the reproduced sound in the radio. The impedance of the high-pass filter for the radio frequency noise is chosen to define a cut-off frequency. On the other hand, the resistor 3005 and the capacitor 3004 constitute a delay circuit. The delay circuit in the noise detector 30 is connected to gate of a field-effect transistor 7001 in an amplifier 70. The amplifier 70 further includes a transistor 7002, capacitors 7003, 7004, 7005, 7006 and 7007 and resistors 7008, 7009, 7010, 7011 and 7012. The amplifier 70 is connected to the base of a transistor 8001 in a pulse signal generator 80. The transistor 8001 is responsive to the detector signal fed from the noise detector 30 through the amplifier 70 to turn on. The emitter of the transistor 8001 is connected to an automatic gain control-responsive switching circuit 8002 via a capacitor 8003 and a diode 8004. The switching circuit 8002 is connected in parallel with a Zener diode 8005 and comprises a transistor 8006. The base of the transistor 8006 is connected to an automatic gain control reference voltage source 8007. The transistor 8006 is turned on while the reference voltage applied to the base thereof exceeds the signal voltage applied to the collector through the transistor 8001 and the diode 8004. When the transistor 8006 is turned on, the resistor 8008 in the switching circuit 8002 is connected to the transistor 8001 in parallel with a capacitor 8009. As is apparent, charge period of the capacitor 8009 depends on the duration of the activation of the switching circuit 80, in that, when the transistor 8006 is on, the charge period of the capacitor 8009 is shortened. The pulse signal generator 80 is connected to a signal generator 60 which is designed to function as set forth with reference to FIG. 18. The signal generator 60 comprises a capacitor 6001, a resistor 6002 and a transistor 6003. The base of the transistor 6003 is connected to the pulse signal generator 80. The duration for which the transistor 6003 is turned on decreases as the charging period of the capacitor 8009 decreases. Therefore, the cut-off frequency of the radio frequency interference elimination circuit 20 varies as shown in FIG. 19 and thus the transitions of the radio frequency level at the detector output level become moderate.

Thus, the present invention fulfills all of the objects and advantages sought therefor.

While the invention has been described in detail with the specific embodiment, the invention must be understood as including all the possible modifications or embodiment embodying the invention without departing from the principle of the invention.

What is claimed is:

1. A radio frequency interference elimination device in an automotive radio receiver comprising
   a radio circuit for receiving a radio broadcasting signal suitable for audio reproduction;
   a noise detector for detecting radio frequency interference noise due to automotive electric circuits, said detector being electrically connected to power source wiring to receive radio frequency interference noise therefrom and produce a detector signal when said noise is detected; and
   a radio frequency interference elimination circuit disposed within said radio circuit and responsive to said detector signal to hold said radio broadcasting signal level at an immediately preceeding level for a given period of time and outputting the held level of radio broadcasting signal for reproduction, said radio frequency interference elimination circuit including first and second switches and a capacitor, said first switch being connected to said noise detector to open in response to said detector signal and said second switch being connected to an automatic gain control circuit to open while the inputted radio broadcasting signal level is lower than an automatic gain control reference level, and said capacitor adapted to be charged by the radio broadcasting signal level.

2. A radio frequency interference elimination device in an automotive radio receiver comprising:
   a radio receiver circuit for receiving a radio broadcasting signal and reproducing an audio sound;
   a detector for detecting a radio frequency interference noise in automotive electric circuits and producing a detector signal upon detecting said radio frequency interference noise, said detector being connected to electric power source wiring to pick up noise components therefrom, said detector being adapted to absorb relatively low frequency noise and produce said detector signal in response to relatively high frequency noise; and
   a radio frequency interference elimination circuit provided within said radio receiver circuit and including a sample/hold means which is normally in a sample mode for sequentially sampling radio broadcasting signal inputted thereto and is responsive to said detector signal to be placed in a hold mode to hold the signal level of said radio broadcasting signal for a given period, said sample/hold means outputting a signal at the held level while it is maintained in said hold mode, said radio frequency interference elimination circuit including first and second switches and a capacitor, said first switch being connected to said noise detector to open in response to said detector signal and said second switch being connected to an automatic gain control circuit to open while the inputted radio broadcasting signal level is lower than an automatic gain control reference level, and said capacitor adapted to be charged by the radio broadcasting signal level.

3. A radio frequency interference elimination circuit for an automotive radio receiver circuit with an automatic gain control comprising:
   a radio receiver circuit including an antenna, a high frequency amplifier, an intermediate frequency amplifier, a signal detector, a voice frequency amplifier and a speaker;
   a noise detector for detecting noise created in automotive electric circuits to produce a detector signal upon detecting radio frequency interference noise, said detector being connected to electric power source wiring of the automotive vehicle and adapted to detect said noise flowing through said wiring; and
   a radio frequency interference elimination circuit interpositioned between said signal detector and said voice frequency amplifier for sequentially sampling detector output and outputting the sampled level thereof, said radio frequency interference elimination circuit being responsive to said detector signal to hold the detector signal and output the held level thereof to said voice frequency amplifier as long as said detector signal is inputted, said radio frequency interference elimination circuit including first and second switches and a capacitor, said first switch being connected to said noise detector to open in response to said detector signal and said second switch being connected to said automatic gain control to open while the inputted radio broadcasting signal level is lower than an automatic gain control reference level, and said capacitor adapted to be charged by the radio broadcasting signal level.

4. The device as set forth in claim 1, 2 or 3 wherein said noise detector comprises a high-pass filter and a delay circuit, said high-pass filter being adapted to absorb relatively low-frequency noise and having impedance defining a cut-off frequency for relatively high-frequency noise.

5. The device as set forth in claim 4, wherein said impedance of said high-pass filter relative to said relatively high-frequency noise is substantially equal to that of said wiring.

6. The device as set forth in claim 1, 2 or 3 wherein said noise detector comprises first and second delay circuit, said first delay circuit controlling timing of said second delay circuit so that said noise detector defines a period in which said radio frequency interference elimination circuit holds the radio broadcasting signal level.

7. The device as set forth in claim 6, wherein said first and second delay circuits respectively include first and second capacitors having capacitances determined relative to each other, said first capacitor in said first delay circuit defining the charge period and charge level of said second capacitor to define the holding period of said radio frequency interference elimination circuit.

8. A radio frequency interference elimination device in an automotive radio receiver comprising:
   a radio receiver circuit for receiving a radio broadcasting signal suitable for audio reproduction;
   a noise detector for detecting radio frequency interference noise due to automotive electric circuits, said detector being electrically connected to power source wiring to receive radio frequency interference noise therefrom and produce a detector signal when said noise is detected; and
   a radio frequency interference elimination circuit disposed within said radio receiver circuit and after a detector stage thereof and responsive to said detector signal to hold said radio broadcasting signal level at an immediate preceeding level for a given time period and outputting the held level of said radio broadcasting signal for reproduction, said radio frequency interference elimination circuit comprising first and second switches and a capacitor, said first switch being connected to said noise detector to open in response to said detector signal and said second switch being connected to an automatic gain control circuit to open while the inputted radio broadcasting signal level is lower than an automatic gain control reference level, and said capacitor is adapted to be charged by the radio broadcasting signal level.

9. A radio frequency interference elimination device in an automotive radio receiver with an automatic gain control, comprising:
   a radio receiver circuit for receiving a radio broadcasting signal and reproducing an audio sound;
   a detector for detecting a radio frequency interference noise in automotive electric circuits and producing a detector signal upon detecting said radio frequency interference noise, said detector being connected to electric power source wiring to pick up noise components therefrom, said detector being adapted to absorb relatively low frequency noise and produce said detector signal in response to relatively high frequency noise; and
   a radio frequency interference elimination circuit provided within said radio receiver circuit after a detector stage thereof and including a sample/hold means which is normally in a sample mode for sequentially sampling radio broadcasting signal inputted thereto and is responsive to said detector signal to be placed in a hold mode to hold the signal lever of said radio broadcasting signal for a given time period, said sample/hold means outputting a signal at the held lever while it is maintained in said hold mode, said radio frequency interference eliminaton circuit comprising first and second switches and a capacitor, said first switch being connected to said noise detector to open in response to said detector signal and said second switch being connected to an automatic gain control circuit to open while the inputted radio broadcasting signal level is lower than an automatic gain control reference level, and said capacitor is adapted to be charged by the radio broadcasting signal level.

10. A radio frequency interference elimination device for an automotive radio receiver circuit with automatic gain control, comprising:
    a radio receiver circuit including an antenna, a high frequency amplifier, an intermediate frequency amplifier, a signal detector, a voice frequency amplifier and a speaker;
    a noise detector for detecting noise created in automotive electric circuits to produce a detector signal upon detecting radio frequency interference noise, said noise detector being connected to electric power source wiring of the automotive vehicle and adapted to detect said noise flowing through said wiring; and
    a radio frequency interference elimination circuit interpositioned between said signal detector and said voice frequency amplifier for sequentially sampling detector output and outputting the sampled level thereof, said radio frequency interference elimination circuit being responsive to said detector signal to hold the detector signal level and output the held level thereof to said voice frequency amplifier as long as said detector signal is inputted, said radio frequency interference elimination circuit comprising first and second switches and a capacitor, said first switch being connected to said noise detector to open in response to said detector signal and said second switch being connected to an automatic gain control circuit to open while the inputted radio broadcasting signal level is lower than an automatic gain control reference level, and said capacitor is adapted to be charged by the radio broadcasting signal level.

* * * * *